United States Patent [19]

Martin et al.

[11] 4,427,886
[45] Jan. 24, 1984

[54] LOW VOLTAGE FIELD EMISSION ELECTRON GUN

[75] Inventors: Joe A. Martin; Max G. Lagally, both of Madison, Wis.

[73] Assignee: Wisconsin Alumni Research Foundation, Madison, Wis.

[21] Appl. No.: 404,398

[22] Filed: Aug. 2, 1982

[51] Int. Cl.³ .................. G01N 23/225; H01J 19/24; H01J 19/32; H01J 29/46
[52] U.S. Cl. .................. 250/310; 315/31 R; 313/336; 313/446; 313/448
[58] Field of Search .................. 313/336, 448, 446; 315/31 R; 250/310

[56] References Cited

U.S. PATENT DOCUMENTS

| | | |
|---|---|---|
| 3,355,618 | 11/1967 | Coleman . |
| 3,678,333 | 7/1972 | Coates et al. . |
| 3,766,427 | 10/1973 | Coates et al. . |
| 3,846,663 | 11/1974 | Komoda . |
| 3,849,647 | 11/1974 | Kolke et al. . |
| 3,863,095 | 1/1975 | Tonomura et al. . |
| 3,925,664 | 12/1975 | Coates et al. . |
| 3,927,321 | 12/1975 | Welter . |
| 3,931,517 | 1/1976 | Coates et al. . |
| 3,931,519 | 1/1976 | Coates et al. . |
| 3,946,268 | 3/1976 | Welter . |
| 3,959,651 | 5/1976 | Welter . |
| 4,020,387 | 4/1977 | Coates et al. . |

*Primary Examiner*—Alfred E. Smith
*Assistant Examiner*—Jack I. Berman
*Attorney, Agent, or Firm*—Isaksen, Lathrop, Esch, Hart & Clark

[57] ABSTRACT

A field emission electron gun (10) is disclosed which has an extraction electrode, composed of one or more sharply pointed electrode tips (17) in close proximity to a field emission cathode tip (11), such that a relatively low voltage between the cathode tip (11) and the extraction electrode tips (17), in the range of 100 to 2000 volts, will cause field emission of electrons from the cathode tip due to the extremely high localized electric field at the cathode tip. The electrons in the beam extracted from the cathode (11) are at a relatively low kinetic energy, particularly adapting the beam for use in such applications as low energy electron microscopy and low energy electron diffraction. For such applications, the extracted beam is generally passed through a limiting aperture member (21), electrostatic lenses (24, 25), and a deflection coil (26) when scanning of the target (27) is desired.

30 Claims, 6 Drawing Figures

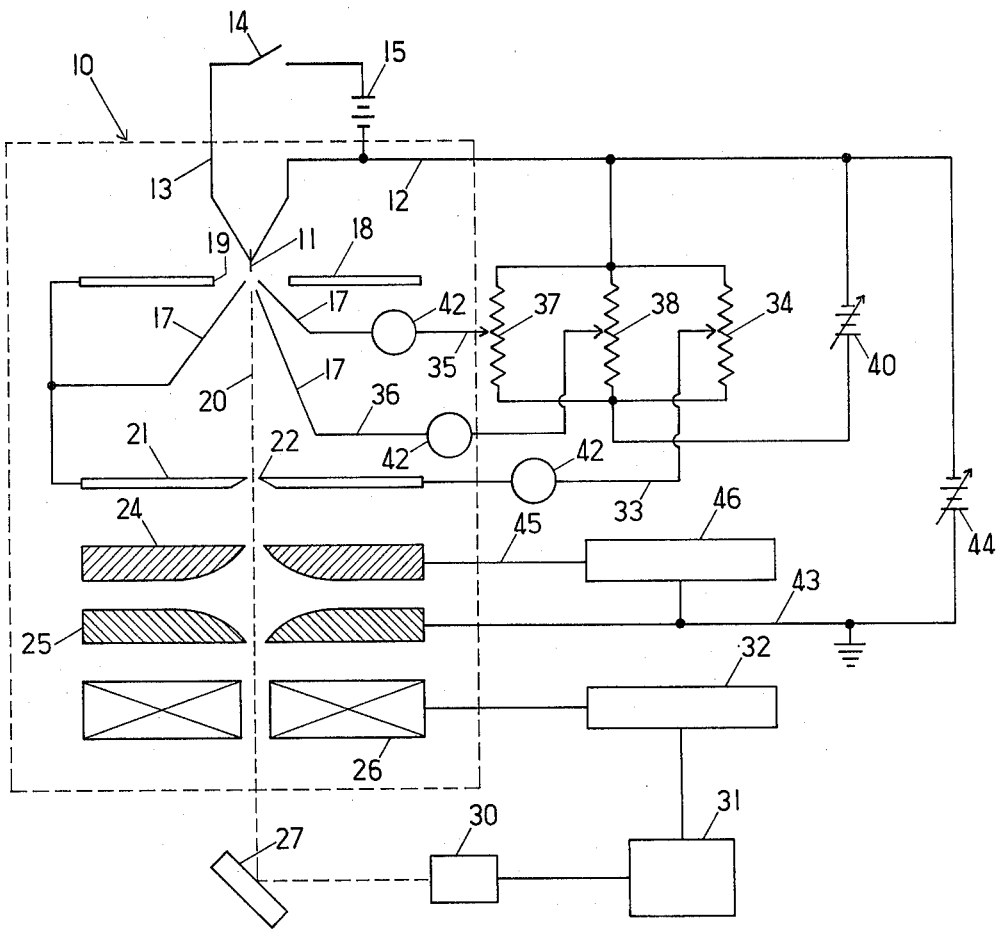
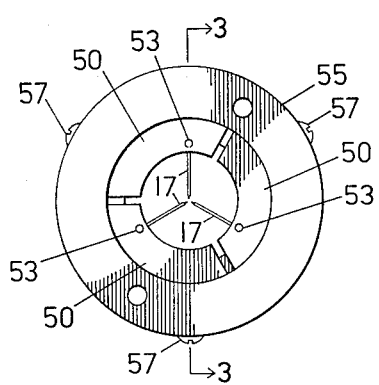
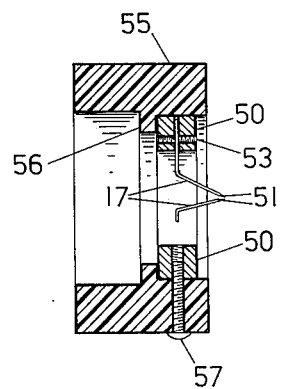

LOW VOLTAGE FIELD EMISSION ELECTRON GUN

The Government has rights in this invention pursuant to Grant No. 144-M645 and IPA No. 0001 awarded by the National Science Foundation.

TECHNICAL FIELD

This invention relates generally to electron field emission systems such as electron microscopes and diffractometers, and particularly to electron field emission guns for such systems.

BACKGROUND ART

Electron beams utilized in various analytical instruments may be generated by one of two fundamental electron emission processes: thermionic emission and field emission. The two emission processes are not exclusive, and some instruments use both phenomena, as, for example, electron microscopes which use the thermal field mode of operation.

Thermionic emission has been the most common mechanism by which electrons are liberated from a cathode. In thermionic emission, the cathode is heated to transfer energy to upper energy-level electrons, providing sufficient kinetic energy to them to allow them to escape the surface barrier of the solid cathode. Once the electrons leave the surface of the cathode, they may be accelerated and focused by electron lenses.

The thermionic emission process has been most commonly used in the past because of the simplicity of thermionic cathode construction, relatively long cathode lifetimes, and high total current capabilities. The primary disadvantage in analytical instruments of the thermionic emission process is the inherently low current density (low brightness) of the beam emitted from the cathode.

Electron beams obtained from field emission sources generally have an inherently high current density (high brightness) but a relatively low total current capability. The construction of field emission cathodes is more difficult than for thermionic emission cathodes, and the lifetimes of field emission cathodes are generally shorter than the lifetimes of thermionic cathodes.

Electron field emission guns have been developed for use in practical analytical instruments requiring finely-focused, primary electron beams, such as electron microscopes. Beam diameters as small as a few tens of angstroms have been obtained by operating such instruments at very high energies, in the range of one to two hundred thousand electron volts. Field emission processes are naturally suited to use in such high energy instruments since high voltages are normally required to obtain field emission.

High energy electrons have a relatively large penetration depth into materials and cause greater damage to the material than low energy electrons. If surface information concerning a sample is desired, or if sample damage is to be minimized, it is more appropriate to utilize a low energy electron probe. For example, the penetration depth of a 100 eV electron is only a few atomic layers in most solids. Despite the need for low-energy electron probe systems, the development of practical low-energy instruments has proceeded more slowly than high-energy instruments because of the difficulty encountered in constructing low energy electron sources and lenses which nonetheless have high resolution. Although the ultimate spatial resolution attainable using low energy electron beams is less than that attainable with high energy beams, due to a greater space-charge interaction time associated with low energy beams, substantial improvements in resolution over that attainable with present instruments is possible.

The field emission phenomenon requires very high electric field intensities at the emission surface, in the range of $10^8$ volts per centimeter. It is possible to increase the electric field intensity at an emission surface by increasing the magnitude of the voltage applied between the emission surface and an adjacent electrode or by decreasing the separation between the emission surface and the reference electrode (anode). Electric field intensity can also be increased by decreasing the radius of curvature of the emitting surface. Thus, a sharp emission (cathode) tip and a high extraction voltage between the cathode and a reference anode are commonly employed in practical field emission instruments. The emission tips are usually electrochemically etched from small diameter wire so that the radius of the end point of the tip is a few hundred angstroms.

A typical configuration for a field emission electron gun includes a flat, apertured extraction anode mounted adjacent to a sharp emission cathode tip located opposing the aperture of the anode. The kinetic energy of the electrons emitted from the cathode will be essentially that of the extraction voltage applied between the cathode and anode, usually 5 keV to 10 keV. The energies imparted to electrons by these extraction voltages present no problem in high energy applications, as, for example, transmission electron microscopy, where the electrons must typically be further accelerated to the operating energies on the order of a hundred thousand electron-volts. If, however, an electron beam is to be used in low-energy applications, e.g., surface analysis or analysis of materials sensitive to electron beams, a high extraction voltage is a distinct disadvantage. In low-energy applications, the field emitted electrons must be decelerated with an appropriate lens system before reaching the target sample. The deceleration process tends to spread the electron beam spatially for three reasons. The first is that all electron lenses have aberrations such that a perfectly parallel beam entering the lens will be distorted, with some electrons sent off into directions other than the desired direction. The second reason is that the field-emitted beam is neither perfectly chromatic (mono-energetic) nor perfectly parallel, and thus the lens power will not be correct for all of the electrons entering the lens. The third reason is that electrons tend to repel each other, and the beam spreading due to this repulsion is more pronounced at low kinetic energies than at high energies. In general, the distortion that a lens introduces into a beam entering it will depend on how strongly the lens must interact with the beam. For example, if a lens is required to decelerate a beam from 5 keV to 100 eV and focus it, more beam spreading occurs than if the same lens is required only to decelerate a beam from 400 eV to 100 eV and focus it.

Thus, when a low energy beam is to be produced, it would be most desirable if the energy acquired by the beam in the process of field emission from the cathode were as low as possible, and therefore the voltage applied between the cathode and extraction anode should be as low as possible. The electric field intensity at the cathode may be increased, with the applied voltage kept constant, by decreasing the separation distance between the emission cathode tip and the anode, but it may be noted that the separation distance between such a tip and an apertured, flat-plate anode cannot be reduced indefinitely to increase the electric field intensity at the cathode. This is so because of the finite size effect of the aperture; as the emission tip comes close to the walls in the anode defining the aperture, the anode no longer approximates a large, flat conducting surface and will not generate sufficient electric field strength at the emission tip surface to allow field emission. However, the aperture itself cannot be made arbitrarily small to correct this, since a decrease in the size of the aperture decreases the intensity of the beam because more electrons will be attracted to the plate and fewer will pass through the aperture.

DISCLOSURE OF THE INVENTION

The low voltage field emission electron gun of the invention allows electrons to be emitted at lower applied voltages than previously possible by utilizing an extraction electrode having one or more sharply pointed electrode tips in opposed relation to the cathode tip. The extraction electrode preferably has at least two tips disposed symmetrically about and converging toward the cathode tip, so that the electric field at the cathode is also substantially symmetric. With the extraction electrode tips in close proximity to the cathode tip, a relatively low voltage applied between the cathode tip and extraction electrode tips will result in field emission of a low energy, high current density electron beam which evidences very small angular divergence.

The novel extraction anode of the invention may be constructed with electrode tips formed of fine wire, e.g., tungsten, etched to a fine point, each mounted at one end to a base which can readily be mounted within a conventional electron gun structure so that the point of each of the wire extraction electrodes is adjacent and opposed to the cathode tip. The cathode tip and extraction electrode tips may be formed similarly, but are preferably formed as sharply as feasible to maximize the electric field intensity at the points and to minimize the spread of the electron beam emitted from the cathode. Where multiple extraction electrode tips are utilized, the tips may be electrically insulated from one another so that voltages can be provided individually to the tips to steer the beam extracted from the cathode. By adjusting the potentials on the various extraction electrode tips, it is possible to quickly and easily align the extracted beam with a limiting aperture and with the electron gun lenses.

The low energy, field emitted electron beam produced by the gun of the invention can be utilized in a variety of applications. The narrow, relatively high intensity, lower angular divergence, and low energy spread beams are useful in such devices as low energy electron diffractometers, scanning low energy electron diffractometers, scanning low-energy reflection electron microscopes, and low-voltage scanning electron microscopes. Of course, the gun may also be used as the electron beam source for high energy electron microscopes which strongly accelerate the emitted beam. Small, low energy beams are ideally suited to surface structure determinations of individual small particles or analysis of small regions of a larger surface. Low energy electrons are extremely surface sensitive and are less damaging than high energy beams. Thus, the finely focused, low energy beams may be applied to studies in areas such as surface analysis of polycrystalline materials and powders, analysis of surface defects in the small structures used in the interior of integrated circuits, restricted depth photoresist exposure in the lithographic techniques of integrated circuit manufacture, and structural studies of biological membranes. When utilized in a tuneable low energy scanning electron microscope, such beams can be applied to industrial investigations of powder size and surface contamination.

A field emission electron beam probe system incorporating the invention, such as an electron microscope or diffractometer, includes a sharply pointed field emission cathode tip, a low voltage extraction electrode having one or more extraction tips in proximity to the cathode tip as discussed above, lens electrodes to accelerate or decelerate and focus the extracted electron beam, a target upon which the focused beam impinges, a detector which detects the electrons from the target, and a video receiver or other display unit connected to the detector. For utilization as a scanning low energy electron diffractometer or a scanning low energy electron microscope, the system also includes a deflection coil or coils surrounding the beam path and a scan or deflection control circuit which simultaneously controls the deflection voltage applied to the coils and transmits the scanning signal to the video display unit to produce an image by using the intensity of the electrons from the target to modulate the intensity of the cathode beam generating the video image. As customary, a member or assembly having a limiting aperture is provided in the beam path before the lenses, and a suppression plate having a central opening may also be provided adjacent the cathode tip, with the walls of the opening generally encircling the extraction electrode tips, electrically connected to prevent charging of the various elements of the extraction electrode structure. The electrical supply circuitry for the system is especially adapted for low voltage system operation, and includes means for applying an adjustable low voltage (0-2 KV) to the extraction electrode, with the additional preferred feature of providing adjustable voltages to each of the multiple points of the extraction electrode individually. The low extraction voltage may also be provided to the suppression plate and to the limiting aperture member. The electrons extracted from the cathode will be at a relatively low kinetic energy and can be readily focused without substantial distortion of the electron beam by adjusting the voltage applied to the focusing lens. The applied voltage may be negative, if desired, to decelerate the electrons in the beam to an even lower energy level. The adjustability of the various voltages applied to the lens elements, coupled with the relatively low voltage level at which electrons are emitted from the cathode, allows the electron beam to be accelerated or decelerated over a wide range of desired energies and in a precisely focused, narrow beam.

Under certain operating conditions, all or substantially all of the current emitted from the cathode remains in the electron beam and virtually none of the current is collected by the extraction electrode tips or the limiting aperature assembly. A more intense beam, of higher current and smaller size, may thus be obtained than is possible with present field emission guns in which only a small fraction of the emission current contributes to the beam current. Such high intensity beams are desirable for both low energy and high energy application.

Further objects, features and advantages of the invention will be apparent from the following detailed description taken in conjunction with the accompanying drawings showing a preferred embodiment of a low voltage field emission gun and electron beam probe system incorporating the same in accordance with the invention.

BRIEF DESCRIPTION OF THE DRAWINGS

In the drawings:

FIG. 1 is a schematic view of a field emission electron beam probe system incorporating the invention.

FIG. 2 is a plan view of a portion of the extraction electrode structure utilized in the system of FIG. 1.

FIG. 3 is a cross-sectional view of the extraction electrode structure of FIG. 2 taken along the lines 3—3 thereof.

BEST MODE FOR CARRYING OUT THE INVENTION

Figure 5:
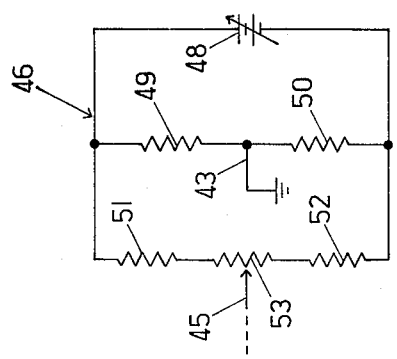
FIG. 5 is a schematic drawing of a circuit for applying an adjustable voltage to the focusing lens in the system of FIG. 1.

With reference to the drawings, a schematic view of a field emission electron beam probe system incorporating the invention is shown generally in FIG. 1. The electron probe system may be utilized, for example, as a scanning electron microscope, a low energy electron diffractometer, or a scanning low energy electron diffractometer. The low voltage field emission electron gun portion of the system is shown generally within the dashed lines labeled 10 in FIG. 1, and includes a sharply pointed field emission cathode tip 11 connected to an electrical lead 12 which provides a negative voltage to the cathode. A circuit composed of a wire 13 attached to the cathode 11, a switch 14, and a voltage source 15, completed through the wire 12, allows the cleaning of the cathode 11 by closing the switch 14 to cause the cathode to be heated. The cleaning of the cathode in this manner may be carried out periodically or continuously, as needed. The cathode 11 may be a standard tip used for field emission devices, typically and preferably having an extremely sharp point, i.e., a very small radius of curvature, in the range of a few hundred angstroms, to minimize the voltages required to cause extraction of electrons from the cathode.

In opposed relation to the cathode tip 11 are a plurality of sharply pointed extraction electrode tips 17 symmetrically arranged about and converging toward the cathode tip. Each of the extraction electrode tips 17 has a sharp point which is in close proximity to the pointed tip of the cathode 11. A circular, conductive suppression plate 18 is also mounted adjacent to the cathode tip 11 and has an central opening defined by a wall 19 therein, with the suppression plate 18 being mounted such that the wall 19 generally encircles the points of the converging electrode tips 17. The beam of electrons 20 extracted from the cathode tip 11 impinges upon a limiting aperture member 21 having a central limiting aperture 22 to define the electron beam passing therethrough. The aperture member or assembly 21 is of a standard design employed in electron microscopes of this nature, and is adapted to capture all electrons in the beam except those which can pass through the aperture 22. After exiting from the aperture 22, the beam 20 passes into the central opening of a first lens element 24 which acts to focus the beam. The beam further passes through a second lens electrode or anode 25 which controls the acceleration of the beam, and thence through deflection coils 26 to impinge upon a target 27. The electrodes 24 and 25 comprise the elements of a lens assembly which may be of standard construction for field emission electron microscopes, and which are well known in the art.

As an example of the utilization of the field emission gun in a scanning beam probe system, electrons which are scattered from the target 27 may be detected by an electron detector 30 which generates a signal proportional to the number of electrons impinging upon it, with this signal being applied to a video display unit 31 such as a cathode ray tube (CRT). The display unit 31 also receives a synchronizing signal from a scan/deflection circuit 32 which controls the deflection coil 26 to cause the electron beam to scan over the pertinent portion of the target 27. The scanning of the target will be synchronized with the image on the video display, modulated by the signal from the detector 30, so that a visual image of the scanned target will appear on the display unit 31.

The suppression electrode 18, one of the extraction electrode tips 17 and the limiting aperture assembly 21 are electrically connected together and are biased by a conducting lead 33 which is connected to the wiper of a potentiometer 34. Similarly, the other extraction electrode tips 17 are connected to conducting leads 35 and 36 which are themselves connected to the wipers, respectively, of potentiometers 37 and 38. A variable voltage source 40 is connected across each of the potentiometers 34, 37 and 38. By means of the variable voltage source 40 and the three variable potentiometers, the voltage applied between the cathode tip 11 and each of the extraction electrode tips 17 can be varied individually. The variable voltage supply 40 may be capable of providing voltages in a typical range of 0 to 2 kV so that the maximum potential difference between the extraction electrode tips 17 and the cathode 11 will be in this range. Preferably, the potential difference between the extraction electrode and the cathode is as low as possible for purposes of the present invention so as to minimize the kinetic energy of the electrons emitted from the cathode. For example, in accordance with the present invention, extraction of field emitted beams may be obtained with potential differences between the cathode and extraction electrode tips as low as 150 volts.

The three extraction electrode tips 17 are symmetrically arranged about the tip of the cathode 11, and the fine adjustment of the voltage provided to the electrodes by means of the potentiometers 34, 37 and 38 allows the beam 20 to be adjustably steered so that it will properly align with the aperture 22 and with the openings in the lenses 24 and 25. Thus, in contrast to present field emission guns, alignment of the electron beam with the various down-stream components can be done very quickly and easily by simple adjustment of electrical controls.

As noted above, the limiting aperture member 21 is of standard design as utilized in various field emission electron microscopes. The suppression plate 18 is provided to suppress the charging of the structure upon which the extraction electrode tips 17 are mounted. Microammeters 42 may be connected in the conducting leads 33, 35 and 36 to measure the current flowing therethrough and thus gauge how much of the electron current extracted from the cathode is being captured by the extraction electrode tips 17, the suppression plate 18, or the aperture member 21. As noted below, under certain conditions the current measured by the microammeters 42 can be made to go to zero.

The acceleration anode or lens element 25 is electrically connected to a lead 43 which is maintained at ground potential, and a variable voltage supply 44 is connected to the grounded line 43 at its positive terminal and to the cathode supply line 12 at its negative terminal. For the low voltage, low energy systems of the present invention, the accelerating voltage provided by the supply 44 may typically be in the range of 0 to 1 kV. The upper focusing electrode 24 is provided with an electrical bias on a line 45 from a focusing control voltage circuit 46. An example of a suitable biasing voltage circuit 46 is shown in the schematic view of FIG. 5, wherein a power supply 48, providing variable voltage in the range of 0 to 5 kV, is connected to a bridge circuit composed of resistors 49 and 50—the grounding line 43 being connected between them—and resistors 51 and 52 and a potentiometer 53 connected in series, with the wiper of the potentiometer 53 connected to the supply lead 45. In this manner, the voltage supply to the focusing lense 24 may be precisely varied over a positive to negative voltage range (e.g., 1 kV to −800 V), allowing the lens 24 to act as a converging lens or a diverging lens.

Using an electron microscope system as described above, it is possible to obtain micrographs of relatively small structures with an electron beam of low energy. For example, with a 150 electron volt (eV) beam having a focusing distance of 10 cm from the last lens element of the gun, a beam diameter in the range of 5 to 10 microns was obtained. With a focusing distance of 4 cm, a beam diameter of less than 5 microns was obtained, allowing resolution of objects in this size range. The beam current was in the range of 5 nanoamperes for an emission current of 10 microamperes. Such beam diameters represent a significant improvement over the 100 to 200 micron beam diameters usually obtained with thermionic emission sources at similar beam energies.

The physical construction of a preferred embodiment of the extraction electrode is shown in the plan view of FIG. 2, looking down on the three symmetrically arranged extraction electrode tips 17 from the cathode side. Each extraction electrode tip 17 may be formed in the same manner as field emission cathode tips, having microscopically sharp points. As illustrated in the view of FIG. 2, and in the cross-sectional view of FIG. 3, the extraction electrode tips 17 are formed from thin conductive wires (e.g., tungsten filament) which each extend radially inwardly from peripherally spaced conductive mounting blocks 50 and are bent upwardly to converge toward a single point, terminating with the points of the tips 17 closely spaced. The mounting blocks 50 are formed of an annular ring of copper divided into the three segments 50, with the ends of each block 50 spaced away from the adjacent block so that each block is electrically isolated. The wires forming the extraction electrode tips 17 are secured within the conducting mounting blocks 50 by set screws 53. The mounting blocks 50 are themselves mounted within a ring shaped ceramic insulating base 55 which has cylindrical interior divided by an inwardly extending annular ring 56 which forms a ridge against which the mounting blocks 50 rest. The blocks 50 are secured in place by bolts 57 which pass through the edge of the base 55 and are threaded into the mounting blocks 50 to hold the same in place. The bolts 57 also provide an electrical connection between the mounting blocks 50—and thus the extraction electrode tips 17—to external conducting leads such as the leads 33, 35, and 36 (not shown in FIGS. 2 and 3).

Figure 4:
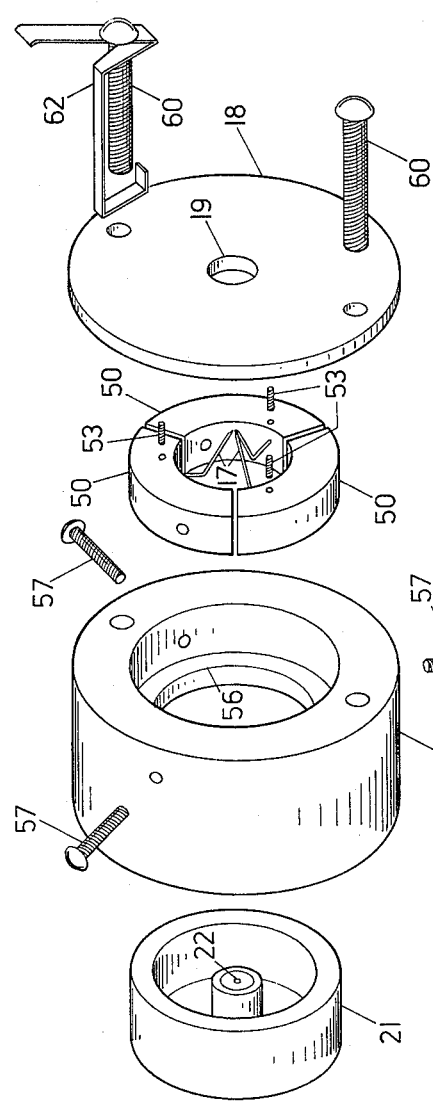
FIG. 4 is an exploded view showing the various parts of the extraction electrode structure, limiting aperture member and suppression plate in accordance with the invention.

Various parts of the electron gun 10 are shown in exploded view in FIG. 4. The suppression plate 18 is mounted to the top face of the ceramic base 55 by attachment bolts 60. The limiting aperture member 21, of standard design, also fits within the central bore of the base 55 and butts up against the side of the inner annular ring 56 opposite to that against which the mounting blocks 50 rest. A metal clip 62 extends from its attachment by one of the mounting bolts 60 to the suppression plate 18, making electrical contact therewith, to electrical contact at its other end to the limiting aperture member 21, thereby providing an electrical connection between the suppression plate and the limiting aperture member. The plate 18 may be made of any good conducting metal, such as copper.

Figure 6:
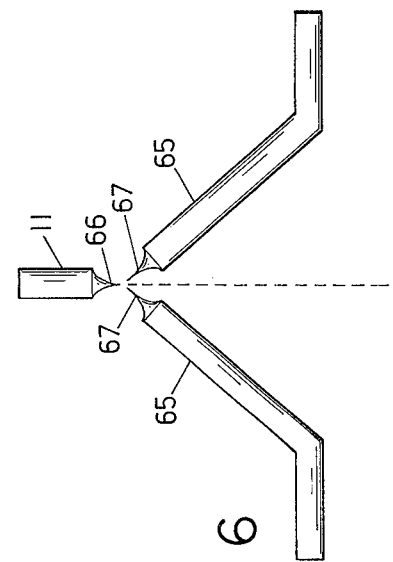
FIG. 6 is a plan view of an embodiment of an extraction electrode in accordance with the invention having two extraction electrode tips opposed to a cathode tip.

As noted above, the three symmetrically arranged, converging extraction electrode tips 17 are a preferred structure since the individual biasing of the electrodes allows steering of the beam extracted from the cathode. However, an extraction electrode in accordance with the invention may consist of a single extraction electrode, such as a single one of the two needle shaped, sharply pointed electrodes 65 shown in FIG. 6. Although two electrodes 65 are shown, the electric field at the emission tip 66 of the cathode 11 is greatly enhanced by the presence of even a single extraction electrode tip in close proximity thereto, allowing field emission of electrons from the tip 66 at applied voltages between the cathode 11 and the extraction electrode 65 much lower than are necessary to obtain field emission in prior structures. The use of at least two symmetrically arranged, elongated, converging, sharply pointed extraction electrode tips 65 is preferred so that the beam of electrons emitted from the cathode 11 is not substantially diverted toward one or the other of the extraction electrodes. The microscopically sharp tip 67 (preferably having an end radius of a few hundred angstroms or less) may be brought microscopically close to the similarly sharp point 66 of the cathode tip 11 without obstructing the path of the beam extracted from the cathode, and the applied voltages and spacing between the cathode tip and extraction electrodes adjusted until emission occurs. Any difference in the microscopic degree of sharpness of the individual extraction electrode tips may be compensated for by mechanical positioning of the cathode emission tip 11 and by providing slightly different bias voltages to the separate extraction electrodes to achieve proper compensation. The view of FIG. 6 illustratively shows that the sharp points 67 of the extraction electrode 65 can be brought very close to the cathode point 66 without physically interfering with the path of the beam extracted, as would a conventional flat plate, apertured extraction anode if brought similarly microscopically close to the point of the cathode 11.

In conventional field emission guns, relatively large emission currents are required to produce much smaller primary beam currents. Most of the emitted electrons are captured by the aperatured extraction anode or the limiting aperature member; only a small fraction of the electrons from the cathode are emitted in a direction such that they will pass through the narrow (e.g., 100 micron diameter) limiting aperature. For example, an emission current of 25 microamperes will typically produce only a 0.0001 microampere primary electron beam.

The electron gun of the present invention will operate effectively under conditions in which a substantial majority of the emitted electrons are captured by the extraction electrode tips 17 and the limiting aperture member 21. However, by properly positioning the cathode tip closely adjacent the tips 17, and adjusting the bias on the tips if necessary, the gun 10 can be made to operate in a mode in which virtually all of the emitted electrons pass through the limiting aperture 22, and none are collected by the extraction electrode tips or the aperture member. The electric field in the area of the cathode tip apparently tightly focuses the emitted electrons so that virtually all will be contained in a beam narrow enough to pass through a 100 micron aperture. A procedure for obtaining this mode of operation is discussed below.

Initially, it is noted that the extraction electrode tips cannot practically be arranged in perfect symmetry about the cathode tip. Taking the three tip configuration shown in FIG. 2 as an example, it is found under a microscope that the end points of the electrode tips do not lie exactly at the vertices of an equilateral triangle. The end points of the electrode tips may be very close together—e.g., approximately 200 microns separation—so that it is very difficult to mechanically adjust the position of the end points, and the spacing between pairs of adjacent tips may vary by several microns from pair to pair. In addition, it is difficult to precisely position the cathode tip equidistant from each extraction electrode tip. However, this assymetry is not a substantial problem since the cathode and extraction electrode tips can be positioned in a configuration in which the effect of any assymetry may be balanced out by adjusting the bias voltages aplied to the individual extraction electrode tips. A configuration which allows balancing by adjustment of the voltages applied to the extraction electrode tips will be termed herein "substantially symmetrical".

As customary in field emission devices, the position of the cathode tip 11 may be adjusted during operation. Before emission begins, the cathode tip is pulled as far away as possible from the extraction electrode tips 17 and the switch 14 is closed to heat the cathode and drive off contaminants. The voltage applied to the extraction tips by the supply 40 is then increased until emission occurs (typically about 2 kV). The cathode tip 11 is then moved in toward the extraction tips, which rapidly increases the emission current. The extraction voltage is then reduced, the cathode moved in closer, and the steps repeated until the extraction potential is at a low voltage level, e.g., 200 V. The current flowing to each extraction tip may be equalized by monitoring the microammeters 42 and adjusting the voltages applied to the electrode tips (e.g., by adjusting the potentiometers 34, 37 and 38) to tend to equalize the current to the electrodes and to properly align the beam with the limiting aperture. The cathode tip is again advanced inwardly and the applied voltage reduced in small increments until a further incremental advance of the cathode causes the emission current collected by the extraction electrode tips 17 and aperture member 21 to drop abruptly to zero. At these conditions, the beam passing through the aperture 22 contains virtually all of the emission current.

It is understood that the invention is not confined to the particular construction and arrangements of parts herein illustrated and described but embraces such modified forms thereof as come within the scope of the following claims.

What is claimed is:

1. A field emission electron gun, comprising:
  (a) a sharply pointed cathode tip;
  (b) at least one sharply pointed extraction electrode tip disposed with the point thereof proximate to the point of the cathode tip; and
  (c) means for applying a voltage between the cathode tip and the extraction electrode tip sufficient to cause field emission of electrons from the cathode tip.

2. A field emission electron gun, comprising:
  (a) a sharply pointed cathode tip;
  (b) a plurality of sharply pointed extraction electrode tips substantially symmetrically arranged about and converging toward the cathode tip with the points thereof proximate to the point of the cathode tip; and
  (c) means for applying a voltage between the cathode tip and the extraction electrode tips sufficient to cause field emission of electrons from the cathode tip.

3. The field emission electron gun of claim 2 wherein three extraction electrode tips are disposed about the cathode tip.

4. The field emission electron gun of claim 1 wherein the voltage applied between the cathode tip and the extraction electrode tip may be selectively varied.

5. The field emission electron gun of claim 2 wherein the voltages applied between the cathode tip and each of the extraction electrode tips may be varied independently.

6. The field emission electron gun of claim 1 or 2 including a focusing lens, an acceleration anode, and means for applying a focusing voltage between the cathode tip and the focusing lens and for applying an acceleration voltage between the cathode and the acceleration anode.

7. The field emission electron gun of claim 6 wherein the means for applying voltages between the cathode tip and the focusing lens and the acceleration anode allows such voltages to be selectively varied, and wherein the means allows the voltage applied between the focusing lens and the cathode tip to be selected to provide a negative potential.

8. The field emission electron gun of claim 6 including a deflection coil surrounding the path of the beam after it passes through the acceleration anode, a target upon which the beam impinges, detector means for detecting electrons from the target and providing a signal indicative thereof, video display means receiving the signal from the detector means and providing a video display, and deflection circuit means for controlling the deflection coils and also providing a signal synchronously to the video display unit such that the beam may be deflected to scan across the target while a simultaneous image is formed by the video display means.

9. The field emission electron gun of claim 1 or 2 wherein the extraction electrodes are formed of thin conductive wire having very sharp points.

10. The field emission electron gun of claim 2 including an insulating base having an opening to allow passage of the electron beam from the cathode therethrough, to which the plurality of extraction electrode tips are mounted, and means on the base for providing electrical connections to each of the extraction electrode tips.

11. The field emission electron gun of claim 10 including a limiting aperture member mounted to the base and having a central limiting aperture in the path of electrons drawn from the cathode, the aperture member adapted to allow passage only of those electrons in the beam which pass through the aperture; and also including a suppression plate mounted to the base having a central opening therein defined by a wall generally encircling the points of the converging extraction electrode tips, the suppression plate being electrically conductive and electrically connected to the limiting aperture member.

12. An extraction electrode adapted for use in an electron beam probe system at a position adjacent to a cathode, comprising:
(a) an insulating base having an opening therein to allow passage of the electron beam from the cathode therethrough;
(b) a plurality of sharply pointed extraction electrode tips mounted on the base and converging toward a single point; and
(c) means on the base for providing electrical connections to each of the extraction electrode tips to allow the same to have a voltage applied thereto.

13. The extraction electrode of claim 12 wherein three extraction electrode tips are mounted on the base.

14. The extraction electrode of claim 12 wherein the electrode tips are formed of fine conductive wire having very sharp points and wherein the means for providing electrical connections to the extraction electrode tips includes conductive mounting blocks mounted to the insulating base to which one each of the electrode tip wires are attached.

15. The extraction electrode of claim 12 wherein the means on the base for providing electrical connections to the extraction electrodes allows each extraction electrode tip to be provided with a voltage independently of the other extraction electrode tips.

16. The extraction electrode of claim 12 including a limiting aperture member mounted to the base and having a central limiting aperture in the path of electrons drawn from the cathode tip, the aperture member adapted to allow passage only of those electrons in the beam which pass through the aperture, and also including an electrically conductive suppression plate mounted to the base and having a central opening therein defined by a wall generally encircling the extraction electrode tips.

17. In an electron beam probe system having a sharply pointed field emission cathode tip, lens electrodes for accelerating or decelerating and focusing the extracted electron beam, a target upon which the focused beam impinges, a detector which detects the electrons from the target, and a video display unit connected to receive the output of the detector and provide a display indicative of electrons received by the detector from the target, the improvement comprising:
(a) a plurality of sharply pointed extraction electrode tips substantially symmetrically disposed about and converging toward the cathode tip; and
(b) means for applying a voltage between the cathode tip and the extraction electrode tips sufficient to cause field emission of electrons from the cathode tip.

18. The system of claim 17 wherein three extraction electrode tips are disposed about the cathode tip.

19. The system of claim 17 wherein the voltage applied between the cathode tip and the extraction electrode tips may be selectively varied.

20. The system of claim 17 wherein the voltages applied between the cathode tip and each of the extraction electrode tips may be varied independently.

21. The system of claim 17 including a focusing lens, an acceleration anode, and means for applying a focusing voltage between the cathode tip and the focusing lens and for applying an acceleration voltage between the cathode tip and the acceleration anode.

22. The system of claim 21 wherein the means for applying voltages between the cathode tip and the focusing lens and the acceleration anode allows such voltages to be selectively varied, and wherein the means allows the voltage applied between the focusing lens and the cathode tip to be selected to provide a negative potential.

23. The system of claim 21 including a deflection coil surrounding the path of the beam after it passes through the acceleration anode, a target upon which the beam impinges, detector means for detecting electrons from the target and providing a signal indicative thereof, video display means receiving the signal from the detector means and providing a video display, and deflection circuit means for controlling the deflection coils and also providing a signal synchronously to the video display unit such that the beam may be deflected to scan across the target while a simultaneous image is formed by the video display means.

24. The system of claim 17 wherein the extraction electrodes are formed of thin conductive wire having very sharp points.

25. The system of claim 17 including an insulating base having an opening to allow passage of the electron beam from the cathode therethrough, to which the plurality of extraction electrode tips are mounted, and means on the base for providing electrical connections to each of the extraction electrode tips.

26. The system of claim 25 including a limiting aperture member mounted to the base and having a central limiting aperture in the path of electrons drawn from the cathode, the aperture member adapted to allow passage only of those electrons in the beam which pass through the aperture; and also including a suppression plate mounted to the base having a central opening therein defined by a wall generally encircling the points of the converging extraction electrode tips, the suppression plate being electrically conductive and electrically connected to the limiting aperture member.

27. A method of extracting electrons from a sharply pointed cathode tip by field emission comprising the steps of:
(a) providing at least two sharply pointed extraction electrode tips disposed about the cathode tip;
(b) adjusting the position of the cathode tip with respect to the extraction electrode tips and adjusting the voltage between the cathode tip and extraction electrode tips such that field emission of electrons from the cathode occurs.

28. The method of claim 27 including the step of selectively adjusting the voltages on each of the extraction electrode tips individually to direct the beam of electrons emitted from the cathode in a selected direction.

29. The method of claim 27 including the additional steps of incrementally advancing the cathode tip toward the extraction electrode tips, then reducing the voltage applied between the cathode tip and extraction electrode tips while maintaining emission, and repeating the steps until substantially no emission current flows to the extraction electrode tips.

30. A method of extracting electrons from a sharply pointed cathode tip by field emission comprising the steps of:
(a) establishing emission of electrons from a cathode tip by applying a voltage between the cathode tip and a plurality of sharply pointed extraction electrode tips disposed substantially symmetrically about and converging toward the cathode tip;
(b) adjusting the position of the cathode tip with respect to the extraction electrode tips and adjusting the voltage between the cathode tip and extraction electrode tips such that substantially no emission current flows to the extraction electrode tips.

* * * * *